United States Patent [19]
Bronner et al.

[11] Patent Number: 5,253,202
[45] Date of Patent: Oct. 12, 1993

[54] WORD LINE DRIVER CIRCUIT FOR DYNAMIC RANDOM ACCESS MEMORIES

[75] Inventors: Gary B. Bronner, Mount Kisco; Sang H. Dhong, Mahopac; Wei Hwang, Armonk, all of N.Y.

[73] Assignee: International Business Machines Corporation, Armonk, N.Y.

[21] Appl. No.: 651,070

[22] Filed: Feb. 5, 1991

[51] Int. Cl.⁵ .................. H01L 29/78; G11C 7/00
[52] U.S. Cl. .................. 365/189.01; 365/230.06; 365/174; 365/189.11; 365/149
[58] Field of Search .............. 365/189.01, 189.05, 365/230.06, 174, 189.11, 149

[56] References Cited

U.S. PATENT DOCUMENTS

| | | |
|---|---|---|
| 3,925,120 | 12/1975 | Saida et al. |
| 4,072,868 | 2/1978 | De La Moneda et al. |
| 4,124,863 | 11/1978 | Mason. |
| 4,642,667 | 2/1987 | Magee. |
| 4,688,063 | 8/1987 | Lu et al. ............ 365/149 |
| 4,697,252 | 9/1987 | Furuyama et al. |
| 4,720,739 | 1/1988 | Bresom. |
| 4,901,280 | 2/1990 | Patel .............. 365/189.11 |

*Primary Examiner*—Eugene R. LaRoche
*Assistant Examiner*—Viet Q. Nguyen
*Attorney, Agent, or Firm*—Pollock, Vande Sande & Priddy

[57] ABSTRACT

A wordline driver circuit for reading the contents of a Dynamic Random Access Memory (DRAM). The circuit is implemented in CMOS and is capable of pulling the wordlines to a negative potential with respect to the substrate, thereby decreasing the access time. An NMOS pull-down transistor channel is implemented as a P-well within an N-well. Applying a negative potential to the source of the pull-down transistor permits the transistor to be switched so that a negative potential is applied to the wordline when the NMOS pull-down transistor is gated into conduction. A PMOS pull-up transistor is serially connected to the NMOS pull-down transistor drain, permitting the wordline to be driven positively.

6 Claims, 6 Drawing Sheets

WORD LINE DRIVER CIRCUIT FOR DYNAMIC RANDOM ACCESS MEMORIES

The present application relates to dynamic random access memory CMOS integrated circuits. Specifically, a circuit for accessing the word line of an array of memory cells is disclosed, having an improved access time.

In microcomputing devices, large-scale storage capacity is necessary which is simple in structure, cost-effective, and does not have burdensome power requirements. The semiconductor art has employed dynamic random access memory (DRAM) architecture which meets these objectives. The DRAM architecture is typically implemented in CMOS technology, wherein a substrate of P+ material supports an array of storage cells. The storage cells typically include a capacitor which is a trench formed in a surface of an N-well formed on a substrate doped to a P+ level. The capacitor trench extends from the surface of the N-well into the P+ substrate. Additionally, each memory cell supports an access transistor which is configured as a PMOS transistor. The PMOS transistor has a drain connected to the trench capacitor and a source which constitutes a bit line and input to a relevant sense amplifier. Each of the PMOS transistors are formed in an N-well, and all of the N-wells of the access transistors are connected together.

The foregoing structure provides for high alpha particle immunity because of the N-well. One end of the trench capacitor has a direct connection to the heavily doped substrate which is connected to a common ground terminal. Thus, any noise appearing on the heavily-doped substrate is effectively isolated by the common ground represented by the substrate.

The memory cells are organized in rows, each row having a common wordline connected to each gate of the gates of all the access transistors of a row. When a condition for reading the cell capacitors of a row is asserted on the wordline, the access transistors for all the cells are rendered conductive, connecting the memory cell capacitor to a respective bit line and sense amplifier. Reading of the wordline is inhibited by asserting the voltage potential VDD on the wordline.

To read the contents of each of the individual cell capacitors, a series of steps are carried out to identify which of the memory cells are to be read. Thereafter the voltage potential is read on the identified memory cell capacitor to determine the logical value represented by voltage stored on the memory cell. In carrying out a typical READ operation, a logic signal from off the DRAM chip is first decoded and latched defining the wordline of the memory cells for which the data is sought. Once sufficient settling time has elapsed to be certain a complete decode has been effected, the wordline is driven for all the memory cells of a row. Additional time is needed to set the sense amplifier to establish a logic state which corresponds to the memory cell data value. Further steps are then needed to read the sense amplifier logic state and buffer its state to drive an off-chip logic circuit.

The foregoing time required to access the memory cells of interest may be upwards to 70 nanoseconds. This time limits the DRAM performance and practitioners in the art have concentrated their efforts in reducing the access time.

The present invention seeks to shorten such access time by greatly improving the speed for driving the wordline to the required voltage for reading a memory cell capacitor. Further, the effort is also directed to maintaining and increasing the signal produced from a memory cell defining either a 1 or 0, thus achieving an improved signal to noise ratio for the sensed logic state, along with an increase in access speed.

SUMMARY OF THE INVENTION

It is an object of this invention to improve the overall access time for reading a dynamic random access memory.

It is a specific object of this invention to provide a wordline drive circuit for a dynamic random access memory having improved access time without suffering any loss of read signal level.

These and other objects are provided by a new DRAM architecture which employs a wordline driver capable of pulling the wordline to a negative potential. The wordline is driven by the circuit between a level of VDD, which will maintain the gates of the access transistors at VDD, to a negative potential in which the access transistor will change to a conducting state more rapidly than was previously obtained.

The wordline driver circuit, in accordance with the invention, includes an on-chip negative voltage generator connected to a trench capacitor. The trench capacitor is formed in the substrate, and isolated therefrom by a silicon dioxide composite insulator. The capacitance of the trench capacitor is set to be several fold times the total wordline capacitance.

Using a negative voltage generator, the trench capacitor is maintained at a negative voltage, which may be approximately $-1$ volts with respect to the substrate.

The wordline is driven by a series combination of a PMOS pull-up transistor and NMOS pull-down transistor serially connected with the trench capacitor. In order to avoid the adverse consequences of connecting the NMOS transistor to a source of negative voltage in which the NMOS transistor would be biased into a conducting state, the NMOS transistor conductive channel is formed by a P-well formed within a N-well on the substrate. This effectively isolates the pull-down transistor, and permits the wordline to be pulled to a negative level of $-1$ volts by selecting a threshold voltage to have a value of approximately $VTN + VWLL$, where VTN is the threshold voltage of an NMOS transistor built on the P on P+ substrate, and VWLL is the desired wordline pull-down voltage.

DESCRIPTION OF THE PREFERRED EMBODIMENT

Figure 1:
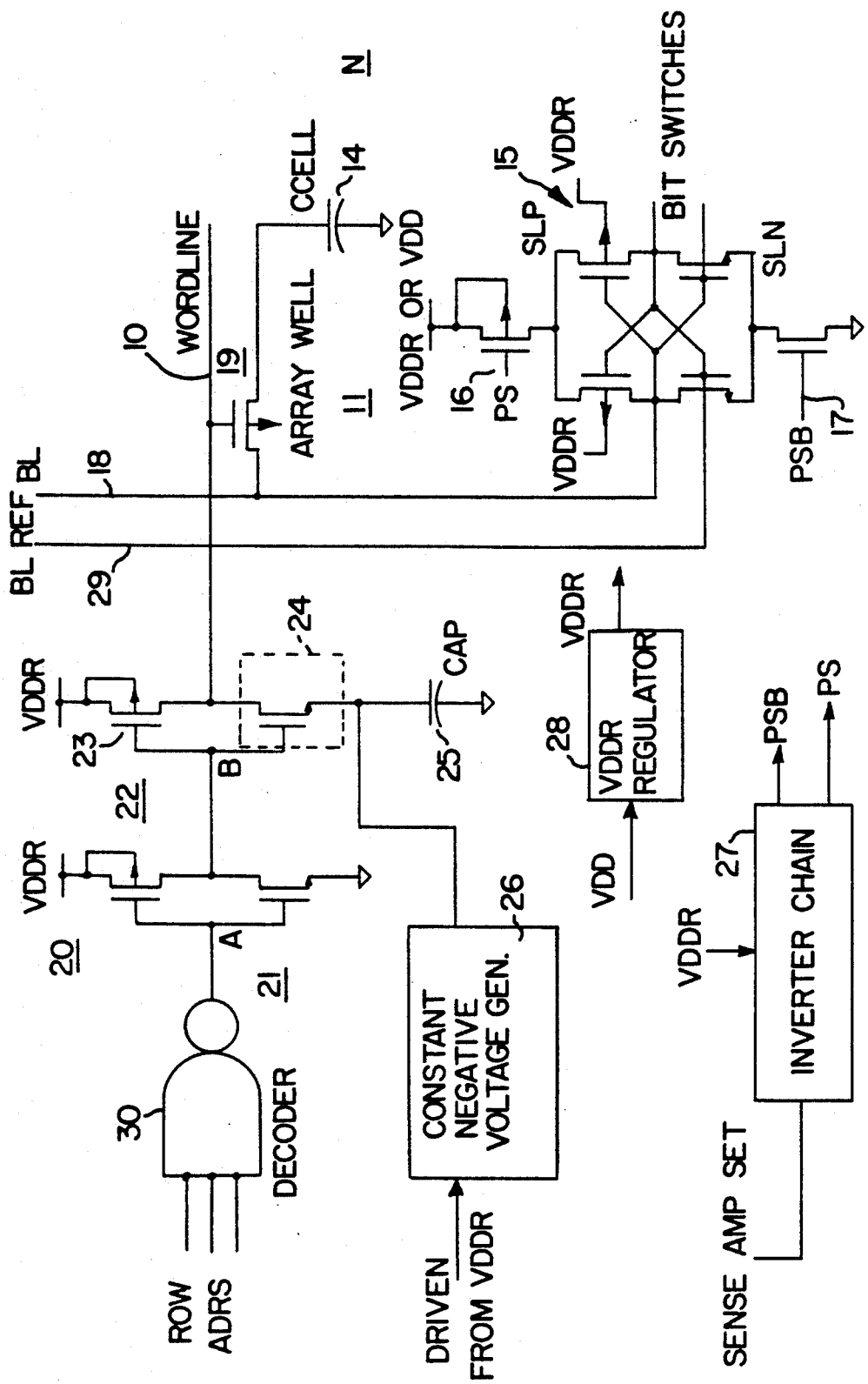
FIG. 1 is a schematic diagram of a circuit which is the preferred embodiment of the invention for driving the wordline of a DRAM.

Referring now to FIG. 1, there is shown a circuit in accordance with the preferred embodiment which is capable of driving the wordline of a DRAM to a negative potential with respect to the substrate which is connected to the common ground connection. The wordline 10 shown in FIG. 1 is connected to a plurality of access transistors, one of which, 19, is shown associated with each single bit memory storage location 11. The single bit storage locations are arranged in rows and columns. Each storage location includes a trench capacitor 14 formed in the substrate which in CMOS technology, is a P on P+ substrate. The trench capacitor 14 is accessed through the PMOS transistor 19, all of which is implemented in CMOS. The N-wells of each of the access transistors 19 are connected together and to the substrate, forming an outer N-well which is effectively grounded. Associated with each memory cell is a sense amplifier 15. The sense amplifier 15 includes two switching signal inputs 16 and 17 for setting the sense amplifier 15 in a state to detect the signal from the memory cell capacitor 14. An inverter chain 27 is shown which provides the requisite switching signals to 16 and 17 from a sense amplifier set signal generated on chip.

The reading of the contents of the memory cell 14 occurs as follows: by bringing the wordline from VDDR to a lower potential, the access transistor 19 is enabled. Typically, this PMOS transistor requires a wordline drive voltage of −0.8 volts or lower for optimum switching performance. In the prior art, the wordline was pulled to approximately 0 volts, equal to the potential on the substrate, thereby rendering the access transistor 19 conductive. At this time, the particular charge on the cell capacitor 14 representing a 1 or a 0 is applied to the bit line 18. The potential on bit line 18 is compared with a potential on bit line reference 29 by the sense amplifier 15. Depending on the difference between the potential on the cell capacitor 14 and the bit line reference 29, the sense amplifier 15 is set in one of two states.

The speed at which the access transistor 19 is brought into conduction to permit the contents of the memory capacitor 14 to be read is at least partially dependent upon the potential on the wordline 10. By bringing the wordline 10 to a negative value with respect to the substrate, the speed at which the access transistor 19 is rendered conductive is increased.

The present invention provides for such negative boosting of the wordline 10 by employing a constant negative voltage generator 26 and trench storage capacitor 25. The negative voltage generated on-chip from the generator 26 is stored on a trench capacitor 25 having a capacitance much larger than the wordline 10 capacitance. The wordline driver circuit includes a pull-down transistor 24 and pull-up transistor 23. The pull-down transistor 24 is shown as an NMOS transistor which is fabricated in a P-well of an N-well on the substrate. The pull-up transistor is a PMOS transistor 23 connected to the supply voltage VDDR.

Normally, connecting any negative potential to the NMOS transistor 24 would tend to bias the transistor to a conducting condition. Therefore, in the prior art it was not considered practical to establish a negative voltage of −1 to the wordline 10, using the NMOS pull-down transistor 24. As will be evident from FIG. 2, an NMOS transistor configured in a P-well, formed in a grounded N-well, permits the source of the NMOS transistor 24 to be returned to a negative voltage.

Figure 2:
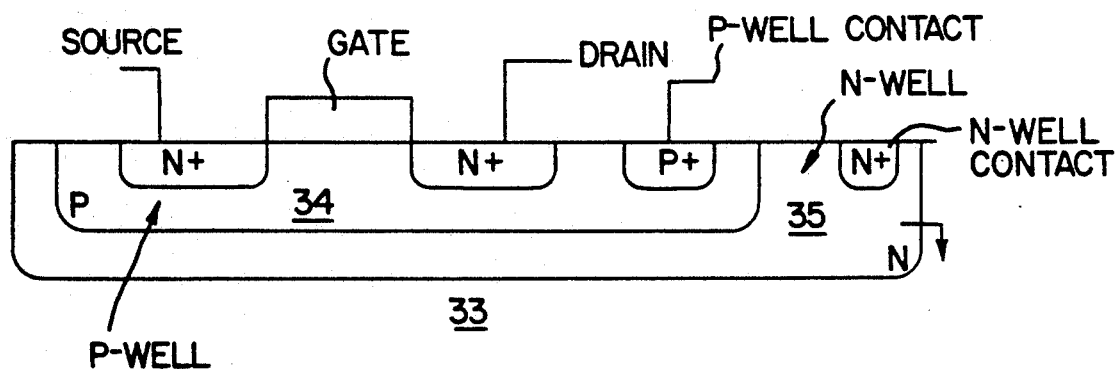
FIG. 2 illustrates the cross-section of the semiconductor topography for implementing an NMOS transistor in a P-well formed in an N-well carried by a P+ substrate.

FIG. 2 illustrates in detail the topography of the NMOS transistor, the P-well 34 within an N-well structure 35 on a P on P+ substrate 33. This particular structure will avoid the consequence of connecting the source to a negative potential, wherein the transistor might be biased to a conducting condition holding the wordline at the negative potential. The P-well 34 forms the conduction channel for the NMOS transistor, and is at the same voltage as the source of the NMOS device. The source of the device is connected to the negative voltage generator. The N-well is connected to ground.

In configuring the dopant levels for the P-well in N-well NMOS transistor of FIG. 2, the threshold voltage is established so that $VTN+VWLL$, where VWLL is the wordline pull-down voltage, and VTN is the threshold voltage of a conventional NMOS device built on a P substrate, which is between 0.5 and 0.6 volts. If the wordline pull-down voltage is nominally −1 volt, the preferred threshold for the P-well in N-well NMOS transistor is approximately 1.5 to 1.6 volts. Using a 1.5 to 1.6 volt threshold for the NMOS device permits the decoder stages to be implemented in regular PMOS and NMOS logic, providing the same noise margin to the wordline driver.

Figure 4:
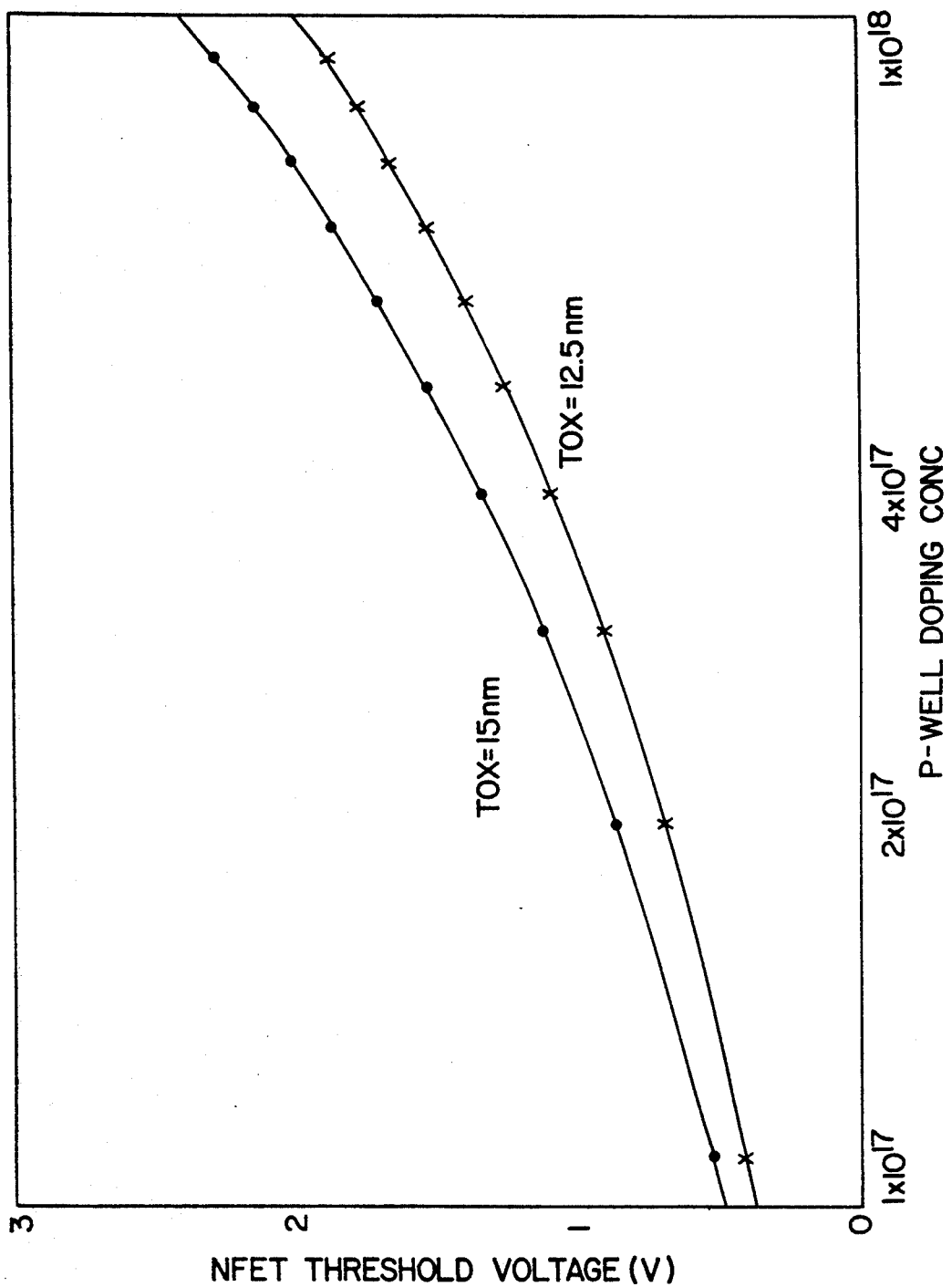
FIG. 4 illustrates the required P-well doping concentration to obtain the threshold voltage for the pull-down NMOS transistor.

FIG. 4 illustrates the P-well doping concentration needed for the P-well in N-well NMOS transistor having conventional CMOS gate thicknesses of 15 nm and 12.5 nm which will obtain the required threshold voltage of 1.5–1.6 volts. Those skilled in CMOS technology will recognize other techniques such as ion implantation which will also achieve the needed threshold voltage.

Thus, the wordline driver may be switched between a −1 volt potential and VDDR using the pull-up, pull-down combination of PMOS and NMOS transistors of FIG. 1 doped according to the table of FIG. 4.

Figure 3:
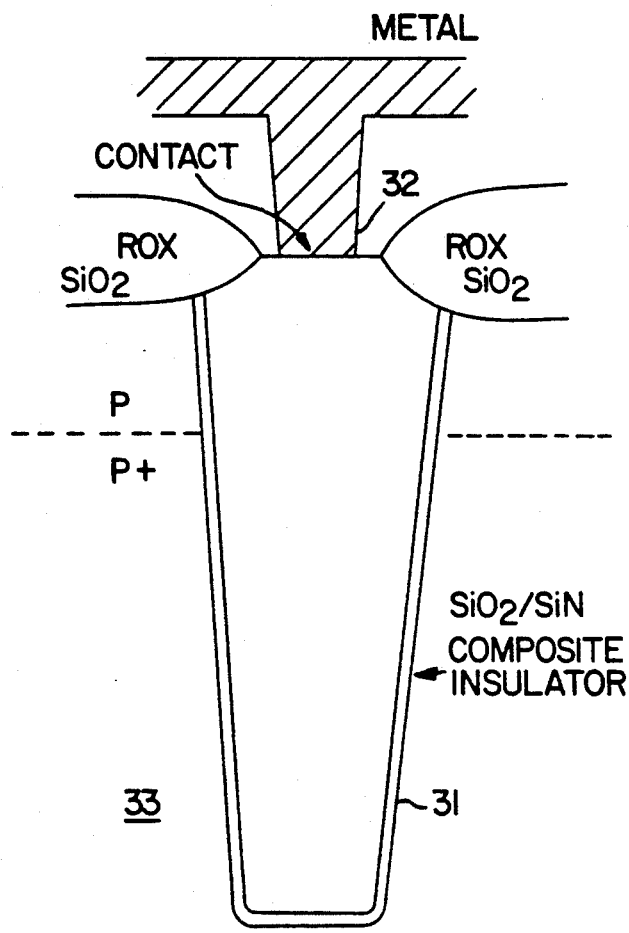
FIG. 3 illustrates the structure of the trench capacitor used for storage of a charge from the on-chip negative voltage generator.

The trench capacitor 25 shown in FIG. 1 for accumulating a charge from the negative voltage generator 26 is illustrated in FIG. 3. The trench capacitor is derived from trenches and diffusion capacitance usurping approximately 90×90 sq. um of substrate surface area. This particular structure is smaller than the area of a conduction pad on the integrated circuit and represents a minimal impact on the surface area. A silicon dioxide/silicon nitride composite insulator 31, having a thickness of 10 nm is shown formed in the P+ substrate. A metal pad 32 is bonded to the top of the trench capacitor to facilitate connection to the negative voltage generator. The usual $SiO_2$ surface insulator is shown covering the top portion of the trench capacitor. The substrate 33 forms the second terminal of the capacitor.

The trench capacitor 25 is employed to reduce the change in the output voltage of the negative voltage generator 26. The capacitor 25 may be approximately 10 times larger than the wordline capacitance. In a 4 megabyte DRAM chip, a wordline capacitance of approximately 15 pf is experienced, and a trench capacitor of 100 pf will provide the stability to the negative voltage generator 26 output signal.

Having thus generally shown how a wordline driver circuit may be configured which will drive the wordline 10 to a negative potential, as well as to the VDDR level, reference may be had to the remaining components needed for the circuit. However, before describing the constant negative voltage generator 26, it should be recognized that a voltage regulator circuit 28, which generates VDDR on chip has been shown in FIG. 1. Generally, VDDR is not greater than VDD. The circuit may be necessary where the potential VDDR is reduced from the high logic signal level produced by the decoder 30. The circuit may be necessary where the maximum voltage levels on the transistors 22 and 24 may have to be limited due to device reliability requirements. Where the decoder 30 supplies a high logic level greater than VDDR, regulation can be obtained with transistor 20 and transistor 21 such as to reduce the effects of the higher logic signal levels on the wordline pull-up and pull-down transistors 23 and 24.

Figure 5:
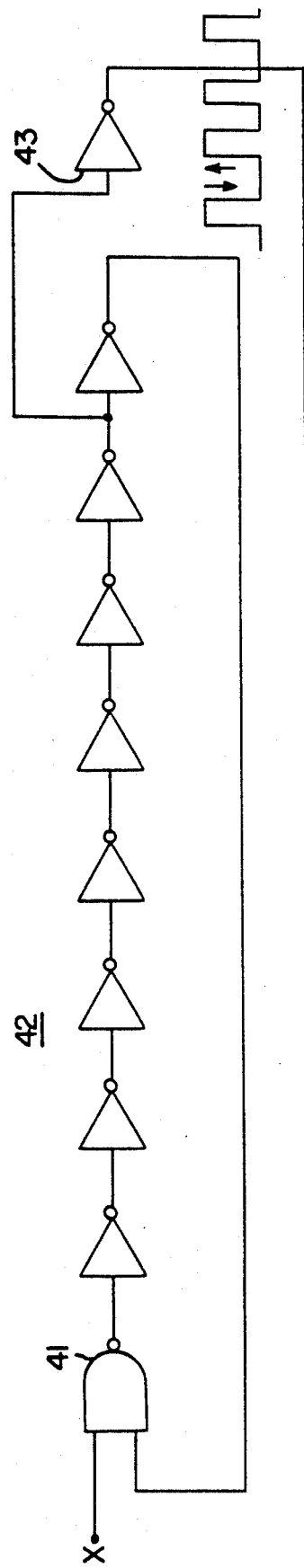
FIG. 5 illustrates the pump circuit to generate a negative on-chip voltage.
Figure 5:
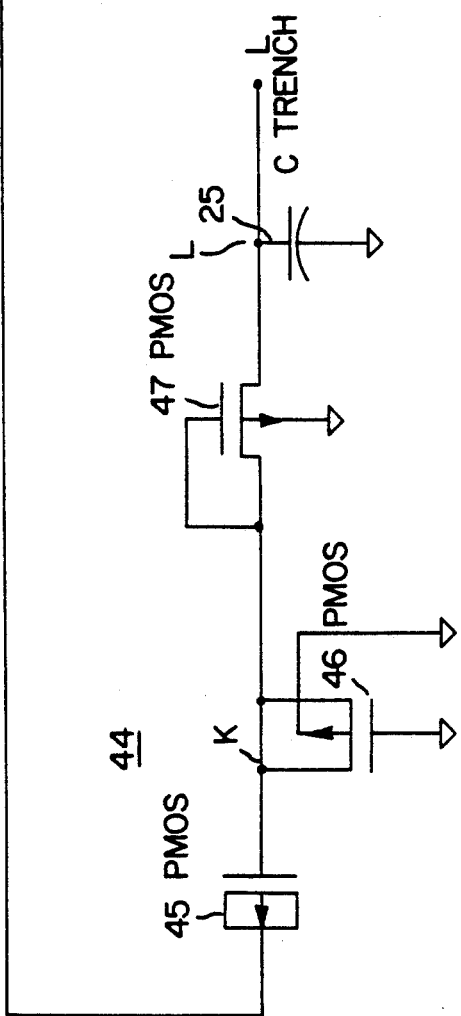

Referring now to FIG. 5, there is shown a pump circuit to generate a negative potential. This negative potential is regulated with the pump regulator of FIG. 7, producing a regulated potential of $-1$ volt.

In FIG. 5, there is shown a ring oscillator comprising a NAND gate 41, a series of inverters 42 and an output buffer amplifier 43. The ring oscillator operates when an ENABLE is applied to the X input of NAND gate 41. This control signal will be provided by the pump regulator of FIG. 7. When the pump regulator of FIG. 7 has determined that the capacitor 25 voltage is below a reference voltage, which in the preferred embodiment is $-1$ volt, NAND gate 41 will be enabled.

The ring oscillator produces a square wave pulse signal with respect to the ground, i.e., the substrate connection for the DRAM. A clamping circuit 44 is shown which receives from the buffer amplifier 43 the square wave pulse signal. A first PMOS transistor 45 is connected to operate as a capacitor. In the shown configuration, the source, drain and N-well are all connected to receive the pulsing square wave signal from inverting amplifier 43.

The PMOS transistor 47 is connected between the gate of PMOS transistor 45 and the capacitor 25. When the voltage at node L representing the voltage across capacitor 25 is greater than the voltage at node K, received from the capacitive coupling provided by PMOS transistor 45, the capacitor 25 is connected to the negative going pulse train signal of the output amplifier 43 via the PMOS transistor 45 gate. During positive excursions of this output squarewave signal, the node K goes positive with respect to the node L, and the PMOS transistor 47 is in a non-conducting condition. At this time, a PMOS transistor 46, having its source and drain connected together, and its gate and N-well connected to ground, operates as a forward biased diode sinking the positive going signal transitions to ground.

Figure 6:
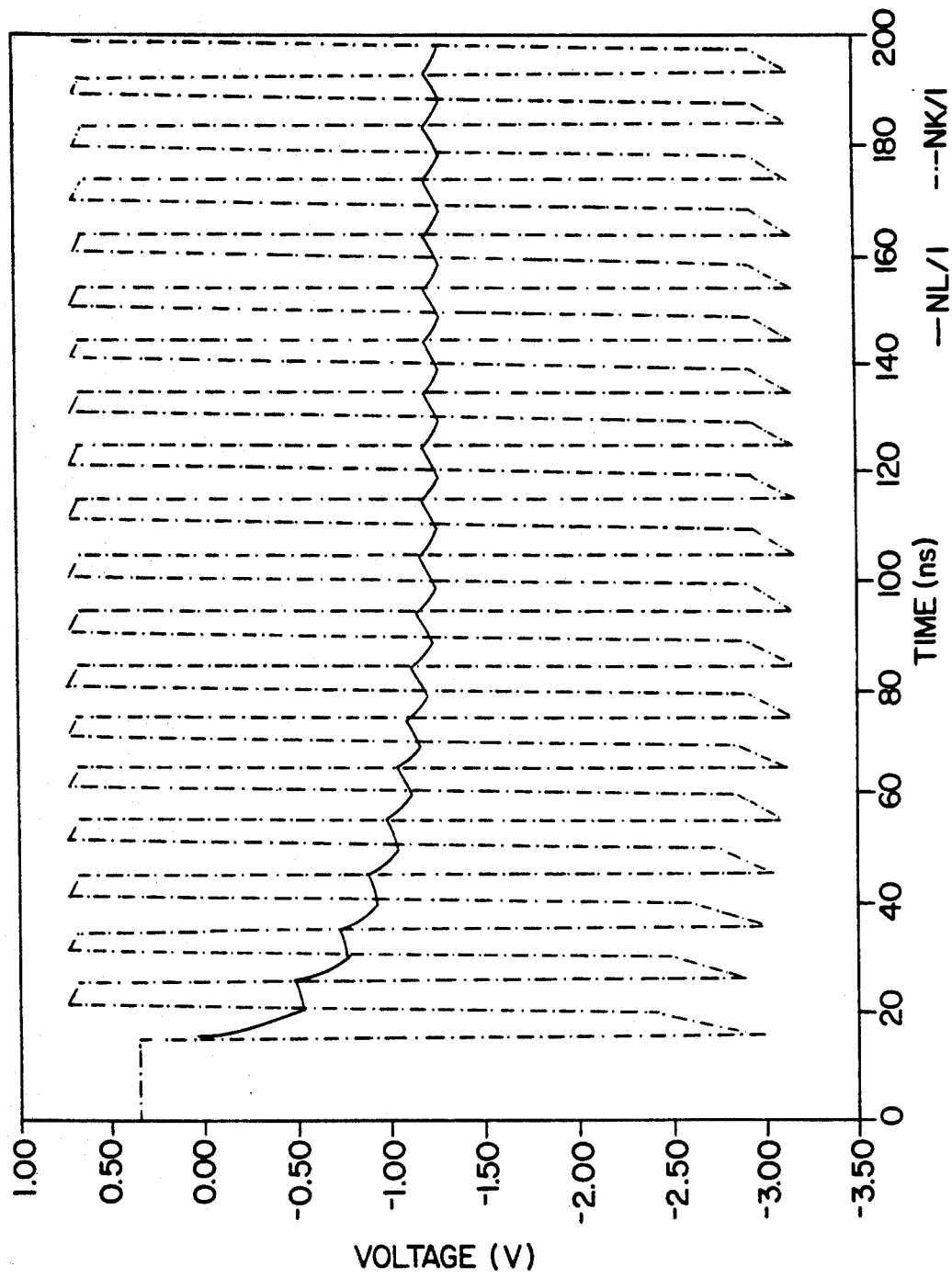
FIG. 6 illustrates the output voltage from the pump circuit as a function of time.

The net effect of the foregoing clamp circuit is to charge the capacitor 25 negatively with respect to the substrate during negative transitions of the squarewave signal. As can be seen in FIG. 6, the negative transitions of the squarewave signal from the ring oscillator result in the negative charging of capacitor 25. During the positive going transitions of the squarewave signal, the charge on capacitor 25 leaks somewhat, but retains the majority of the charge received during the negative-going signal excursion.

Figure 7:
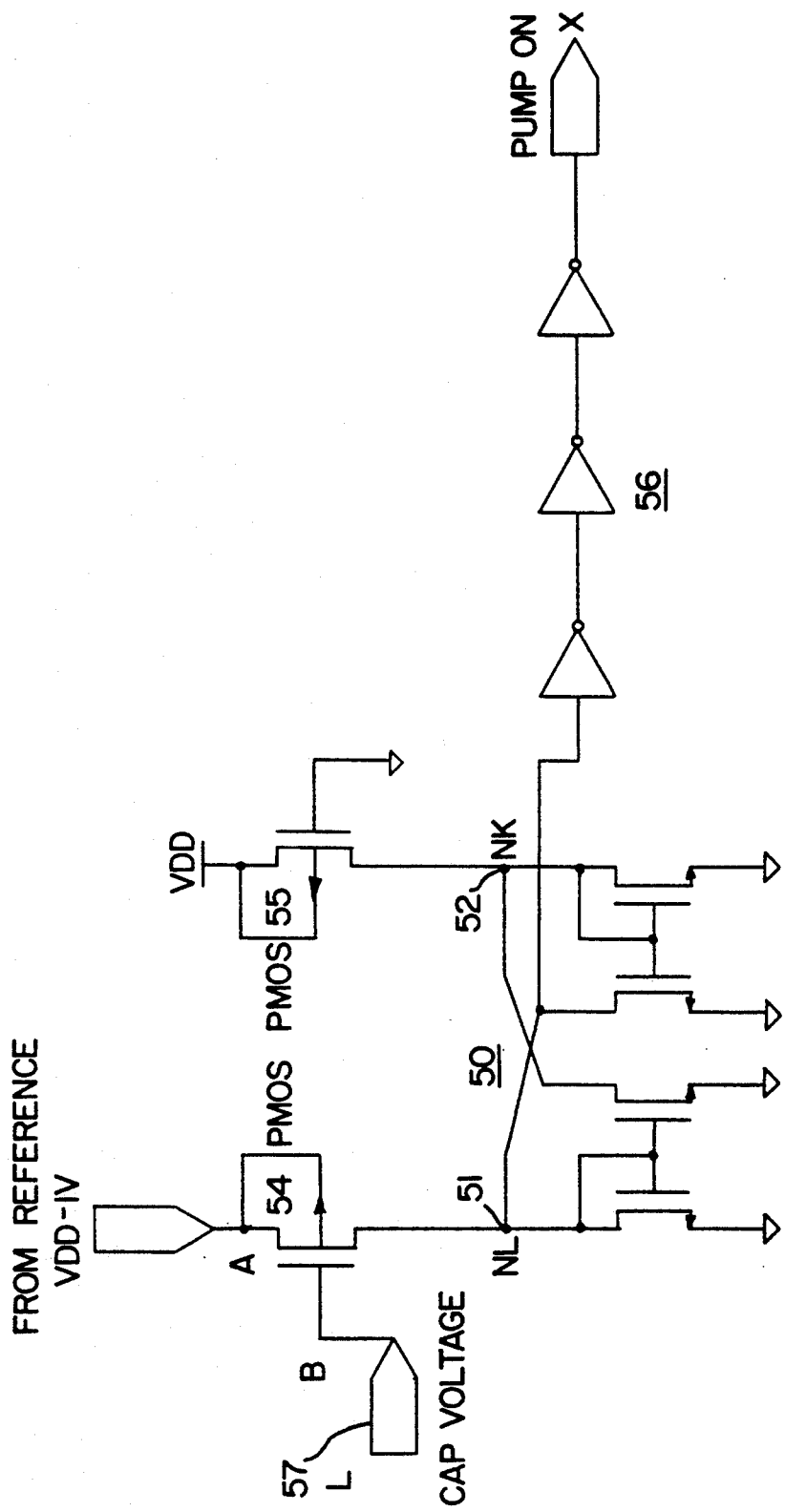
FIG. 7 illustrates a pump regulator circuit for maintaining the negative on-chip voltage to a constant −1 volt.

As is illustrated in FIG. 7, a pump regulator provides an enable and disable logic level to the NAND gate 41 of FIG. 5. This enable signal is developed from a latch 50. Latch 50 receives on one reference node 52 a current from the source voltage VDD through a connected PMOS transistor 55. A complementary node 51 receives through a PMOS transistor 54 a similar current, under control of a gate signal. The gate signal applied to the PMOS transistor 54 is taken from the node L, representing the charging end of the capacitor 25. As the capacitor 25 voltage reaches $-1$ volt, which is VDD below the reference level VDD-1 volt applied to the PMOS transistor 54, transistor 54 will conduct, as the $-1$ volt level is exceeded, tending to switch the latch 50 by providing the required imbalance between switching nodes 51 and 52. At this time, the inverter chain 56 will apply the appropriate logic level signal to NAND gate 41, thus disabling the ring oscillator. The ring oscillator will remain in a disabled condition until the latch 50 is switched by detecting a capacitor voltage at node L to be less than $-1$ volt. At this point, node 52 will be receiving a greater current than node 51 and thereafter the latch 50 switches to enable NAND gate 41.

Thus, it can be seen from the foregoing that it is possible to provide a negative boost to the wordline of a dynamic memory array. The negative boost will not only decrease access time to a row of memory locations, but will provide for an enhanced signal differential distinguishing the 1 and 0 logic state stored on a given memory capacitor. Those skilled in the art will recognize yet other embodiments described by the claims which follow.

Having thus described our invention, what we claim as new and desire to secure by Letters Patent is:

1. A wordline driver for a CMOS dynamic random access memory comprising:
    a PMOS transistor having a source connected to a positive terminal of a voltage source serially connected with an NMOS transistor, said PMOS and NMOS transistor having a common gate connection for receiving a decoder logic signal, and having a common series connection for driving the word line of a row of memory cells;
    a trench capacitor connected at one end to said NMOS transistor drain and connected at a second end to a common substrate which is connected to a negative terminal of said voltage source; and,
    an on-chip voltage generator connected to said one end of said trench capacitor and said substrate for charging said trench capacitor to a potential below the potential of said substrate, whereby said wordline is driven between a positive potential applied to said PMOS transistor source and a negative voltage supplied by said trench capacitor in response to said decoder logic signal.

2. The wordline driver of claim 1, wherein said NMOS transistor is implemented as a P-well forming a conductive channel in an N-well of a P+ substrate.

3. The wordline driver of claim 1 wherein said trench capacitor is formed in said substrate.

4. The wordline driver of claim 1 wherein said on-chip voltage generator comprises:
    a ring oscillator for supplying an alternating pulsed signal;
    a clamping circuit connecting said ring oscillator to said trench capacitor, charging said trench capacitor to a negative voltage with respect to said substrate; and,
    a voltage regulator connected to monitor said trench capacitor voltage and inhibit said ring oscillator when said capacitor has reached a predetermined level.

5. The wordline driver of claim 4 wherein said voltage regulator comprises a cross coupled latch, having two nodes, one of which is connected through a transistor to a source of potential VDD, the other of which is connected through a transistor to a reference source of potential, said second transistor having a gate connected to said trench capacitor.

6. The wordline driver of claim 1 further comprising:
a second PMOS transistor serially connected to a second NMOS transistor, said second transistors forming common gate connections connected to receive said decoder signal, and having a serial connection connected to gate connections of said first PMOS and NMOS serially connected transistors, said second serially connected transistors providing a regulating function when said decoder signal amplitude is greater than the power supply voltage across said first serially connected transistors.

* * * * *